(12) United States Patent
Goodell et al.

(10) Patent No.: US 6,236,259 B1
(45) Date of Patent: May 22, 2001

(54) ACTIVE UNDERSHOOT HARDENED FET SWITCH

(75) Inventors: Trenor F. Goodell, Peaks Island, ME (US); Myron J. Miske, Newfields, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/412,038

(22) Filed: Oct. 4, 1999

(51) Int. Cl.$^7$ ............................................ H03K 3/01
(52) U.S. Cl. .................... 327/534; 327/427; 327/387; 327/437
(58) Field of Search ................... 327/419, 427, 327/379, 384, 387, 389, 530, 534, 535, 309, 310, 437, 391, 434, 397

(56) References Cited

U.S. PATENT DOCUMENTS

| | | | |
|---|---|---|---|
| 5,808,502 | 9/1998 | Hui et al. | 327/333 |
| 5,933,046 | * 8/1999 | Ramet et al. | 327/534 |
| 5,963,080 | * 10/1999 | Miske et al. | 327/534 |
| 6,052,019 | * 4/2000 | Kwong | 327/437 |

* cited by examiner

*Primary Examiner*—Timothy P. Callahan
*Assistant Examiner*—Minh Nguyen
(74) *Attorney, Agent, or Firm*—Pierce Atwood; Chris A. Caseiro (57) ABSTRACT

A bus switch for transferring logic signals between nodes without the problems associated with undershoot conduction. The bus switch is an FET switch including a single primary transfer transistor. The bulk of the transfer transistor is coupled to a differential logic sense circuit that is designed to establish a pseudo low-potential power rail. The logic sense circuit is coupled to the two transfer nodes and a standard low-potential power rail. It compares the potentials associated with the transfer node signals and the low-potential rail and selects the one with the lowest potential to establish the potential of the pseudo low-potential rail. The logic sense circuit provides for active selection of the lowest potential element, including under very small undershoot conditions. The logic sense circuit may be established in a variety of ways, preferably by including a differential comparator pair, one of associated with one of the two transfer nodes and the other differential comparator associated with the other transfer node. Outputs of the differential pair control logic drivers that in turn regulate the transfer node, or standard low-potential rail to be coupled to the pseudo low-potential power rail. This arrangement ensures that there will be no parasitic conduction of the transfer transistor during undershoot conditions.

9 Claims, 6 Drawing Sheets

ACTIVE UNDERSHOOT HARDENED FET SWITCH

BACKGROUND OF THE INVENTION

1. Field of the Invention

The present invention relates to electronic switches. In particular, the present invention relates to semiconductor switches, including those formed of one or more metal-oxide-semiconductor (MOS) transistors. More particularly, the present invention relates to N-type MOS (NMOS) field effect transistor (FET) bus switches.

2. Description of the Prior Art

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are being used more and more as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

It is well known that switches are widely used in many fields. They are used in all variety of large- and small-scale consumer products, including, but not limited to, automobiles and home electronics. They can be and are used as analog routers, gates, and relays. They are used as digital multiplexers, routers, and gates as well.

A number of prior-art transfer gates have been developed for digital and analog applications. Recent innovations have provided methods for operation at lower power supply potentials such as 3.3 Volts and 2.5 Volts, while providing some method of maintaining isolation when input values go beyond high- and low-potential power rail values. That is, when a transfer gate input potential exceeds the high-potential rail Vcc positively, or it exceeds the low-potential rail GND negatively. One such device that has been in relatively common use is shown in FIG. 1

A complementary pair of transistors, NMOS transistor M1 and PMOS transistor M2 conduct signals between nodes A and B, where each of those nodes is couplable to an extended circuit. When a control signal OEN (shown in FIG. 1 associated with node A as the input for purposes of illustration only, but which can also be associated with node B as the input) is a logic "high" or "1," transistor M1 is turned on, and as a result of the inversion produced by inverter 11, transistor M2 is also on. In this condition, the two transistors are "on" and the potential at node B is essentially the same as the potential at node A. When OEN is at a logic "low" or "0," both transistors are off and there exists a high impedance for the transfer of any signal between nodes A and B. This is true for all potentials at node A or B that are less than the potential of high-potential power rail Vcc and greater than low-potential power rail GND. However, when either the input or the output node is greater than Vcc or less than GND, the potential associated with the typical logic low at the gate of transistor M1 and a typical logic high at the gate of M2 is insufficient to keep those transistors off. For a potential greater than Vcc, M2 will turn on, for a potential less than GND, M1 will turn on, irrespective of the logic level applied at input OEN. As a result, an overvoltage condition at either the input or the output will cause M1 and M2 to permit a signal to pass through that the OEN deems should be blocked. An undervoltage condition will likewise be passed under the same OEN condition.

For the purpose of this disclosure, the terms "overvoltage" and "undervoltage" mean the potential variations noted that occur under static (DC) conditions as well as dynamic (AC) conditions. For that reason, overvoltage may be used interchangeably with overshoot. Similarly, undervoltage may be used interchangeably with undershoot. Passage of any of those conditions when OEN deems such conditions should be blocked is undesirable.

Figure 1:
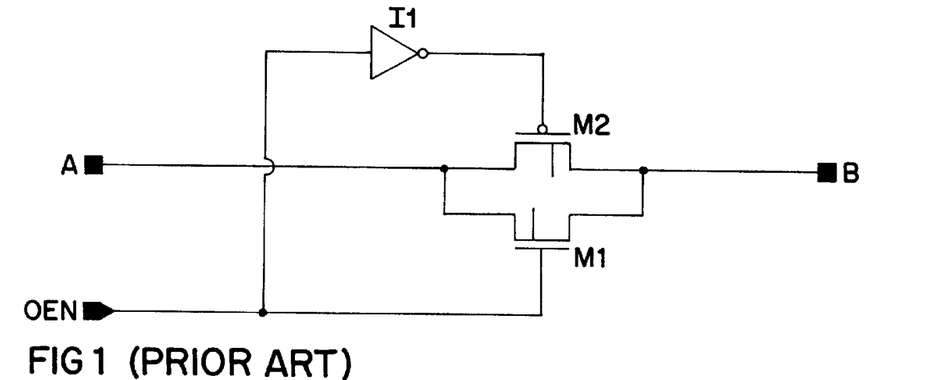
FIG. 1 is a simplified schematic diagram of a prior-art transfer gate having a CMOS transistor pair as the primary transfer element of the transfer device.
Figure 2:
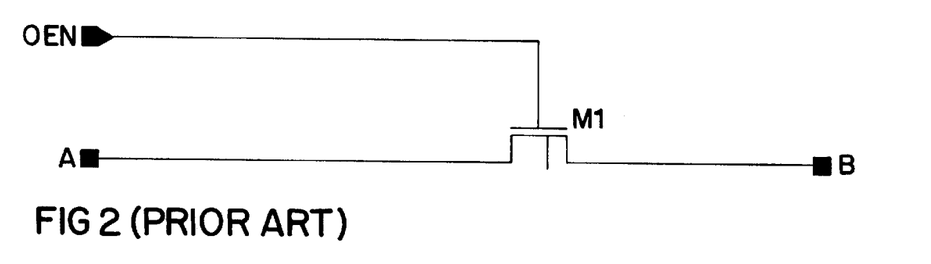
FIG. 2 is a simplified schematic diagram of a prior-art transfer gate having a single enhancement-mode NMOS transistor as the transfer device.

A device designed to resolve at least one portion of the problems associated with the complementary transfer gate of FIG. 1 is shown in FIG. 2. The device involves removal of PMOS transistor M2, leaving NMOS transistor M1 coupled between nodes A and B, where node A is the input from, or output to, a first extended circuit, and node B is the input from, or output to, a second extended circuit. As before, control node OEN is designed to control enablement of M1. In operation, a logic level high from OEN to the gate of M1 renders M1 on and thereby permits a signal to pass between nodes A and B. A logic level low turns M1 off and blocks the transfer of the signal between A and B. Elimination of transistor M2 resolves the problem when the potential at node A or node B exceeds Vcc because that transistor is not there to be turned on. Unfortunately, that does not eliminate the possibility that the transfer gate will turn on when it should be off under conditions of negative voltage exceeding GND.

Figure 3:
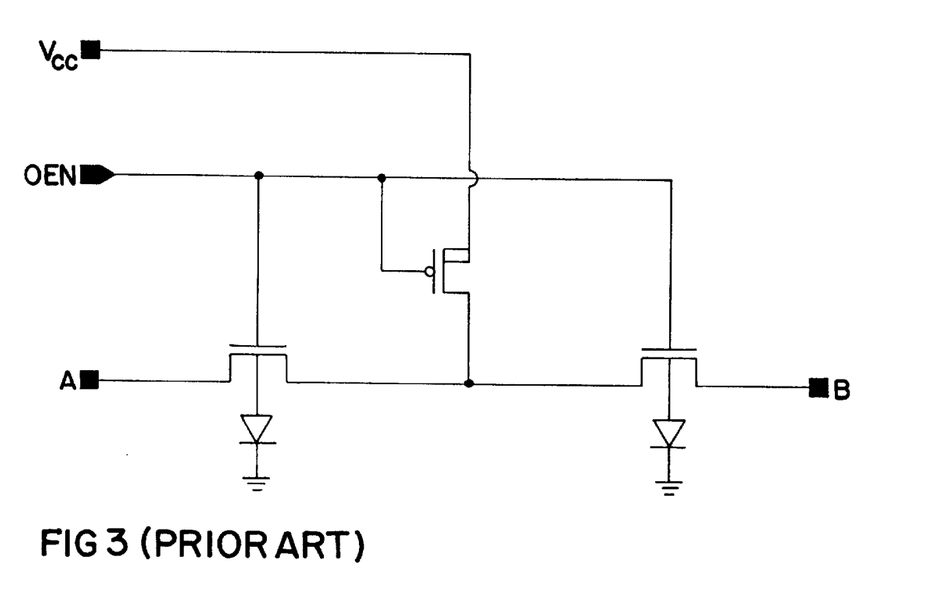
FIG. 3 is a simplified diagram of a prior-art transfer gate having a series of MOS transistors as the primary transfer components of the transfer device.

An alternative and more complex prior transfer gate is shown in FIG. 3. That device includes a series pair of NMOS pass transistors. When OEN transmits a logic low or "off" signal, the circuit of FIG. 3 will remain off, even when Vcc and GND are exceeded. Thus, this circuit is a reasonable alternative to the circuit shown in FIG. 2. However, the effective drain-source resistance $R_{DS}$ associated with using the two NMOS transistors in series is several hundred ohms dependent upon the particular characteristics and coupling of the transistors. While that resistance is acceptable in analog devices, it is not so in digital systems where the RC time constant is a critical consideration in the rate of operation of a circuit. Therefore, this transfer gate would not be particularly suitable for digital circuitry that operates at increasingly faster rates.

U.S. Pat. No. 5,808,502 issued to Hui et al. describes some of the problems noted in association with one-transistor and two-series transistors used to transfer selected signals between nodes or pads. Hui provides a solution of increasing the potential supplied to the gates of the transistors through the use of a charge pump. Such a solution has its own problems, including the noise problem that Hui seeks to solve through the addition of a capacitor coupled to the charge pump. However, the Hui solution involves the use of series transistors to maintain isolation. Series transistor approaches penalize the user since the capacitance of the enabled series transistor transfer gate is much higher than that of a single transistor transfer gate. The capacitances of both FET devices are present on the I/O ports of the transfer gate.

It would be desirable to have a transfer gate operating with a single NMOS transistor as the FET switch substantially as shown in the circuit of FIG. 2. This would address the problems of relatively high resistance and relatively high capacitance experienced at the output of the switch circuit when the circuit is substantially as shown in FIG. 3. However, the prior single NMOS switch of FIG. 2 is unacceptable during undershoot conditions in that there is a parasitic diode connected between either the source or drain of the transistor and its bulk. The bulk is tied to the low-potential power rail usually identified as ground. During voltage undershoot conditions at the low-potential rail, the parasitic diode conducts current from ground to either the input node or the output node, depending upon which is at a potential that is less than ground potential. Under that condition, current will move from the output node to the input node, thereby causing a disruption of signal transmission otherwise occurring at the output node. This can occur independent of the condition of the enable signal at OEN.

Two characteristics of the physical structure of the single NMOS FET switch cause this clearly undesirable parasitic conduction condition. The first is the formation of a parasitic bipolar NPN transistor. The second is the unintended turning on of the NMOS FET switch in certain undershoot situations. With regard to the first condition, the drain (N-type collector), transistor bulk (P-type base), and source (N-type emitter) form the NPN transistor. Transistor fabrication steps currently in use in sub-micron processes can yield in this common-base parasitic bipolar transistor a current gain that is the equivalent of a common-emitter gain ($\beta$) of about 10. Thus, during an undershoot condition, the relatively small current moving from the low-potential rail to the more negative input node yields a ten-fold increase in the undesired parasitic current moving from the output node to the input node. Of course, in an ideal FET switch there should be no current flowing from the output node to the input node unless specifically enabled.

The other undesirable condition associated with the parasitic diode of the prior single-FET switch relates to the unintended turning on of the FET switch during an undershoot event. Specifically, this occurs when there is enough current generated in the substrate of the transistor to cause a voltage drop in the transistor's bulk that is enough to turn the transistor on. If the current developed between the low-potential rail and a lower-potential circuit node causes a drop across the substrate/bulk resistance that is at least the equivalent of the threshold turn-on potential $V_{TN}$ of the transistor, the transistor will conduct current from one circuit node to the other.

Figure 4:
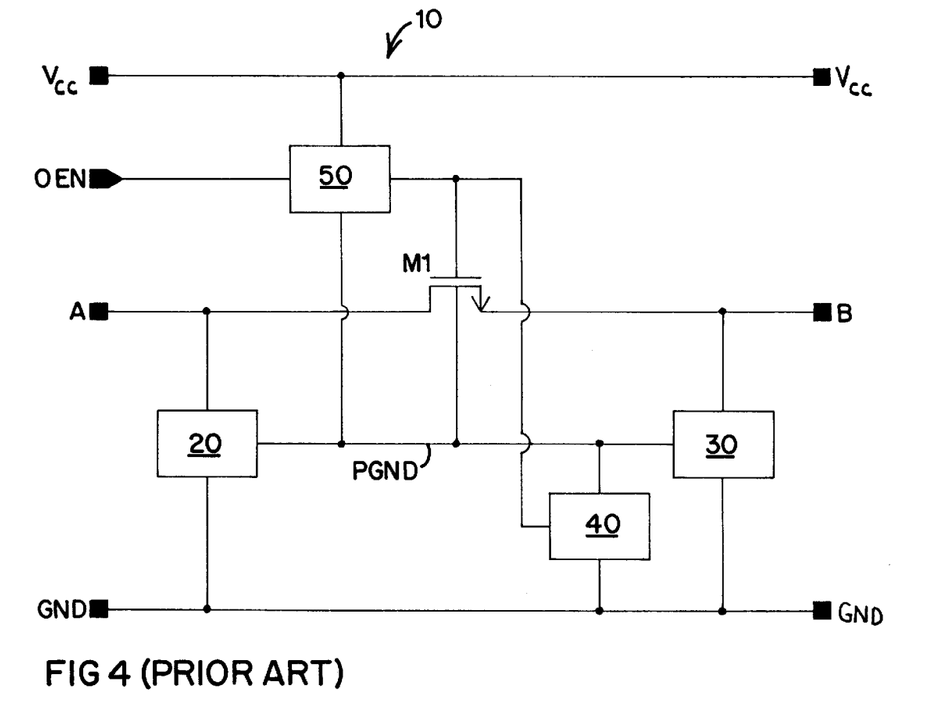
FIG. 4 is a simplified diagram of a prior-art transfer gate including a passive system for undershoot avoidance under certain conditions.

It may be seen that it is necessary to isolate the primary FET bulk from ground when the switch is disabled in order to prevent the parasitic NPN bipolar transistor condition. However, in order to address the second problem condition, it is necessary to keep the primary transistor's gate potential substantially the same as its bulk potential. A related circuit that solves these problems in a passive arrangement is shown in FIG. 4. In that circuit, the switch 10 includes a first arbiter circuit 20, a second arbiter circuit 30, a pseudo low-potential rail PGND, a bulk potential coupling circuit 40, and transfer transistor M1. Enable controller circuit 50, supplied by a standard high-potential power rail Vcc, is used to define a selectable signal to activate the transfer transistor M1. An enable signal coming from a control circuit (not shown) by output enable node OEN is coupled to the gate of M1 and the pseudo-low potential power rail PGND through circuit 50. Transistor M1 is the primary regulator of the transfer of a signal between nodes A and B and is an N-type MOS transistor formed with an isolated P-type well. Either of node A or node B may be an input node or an output node, dependent upon the direction of the signal passing between the external circuitry coupled to those two nodes.

Though the circuit of FIG. 4 addresses the prior problems of undershoot and overshoot situations, it nevertheless it requires a triggering condition (undervoltage or overvoltage) of about one threshold potential drop (Vt) that may be about 0.6V. That is, a differential signal of sufficient magnitude is required in that circuit to activate the comparators sufficiently to tie the transfer transistor's bulk to the pseudo-low potential power rail. In those situations where it is desirable to address the over/under problem more quickly, there may be an undesirable lag associated with the solution of the circuit of FIG. 4. It would therefore be preferable in some situations to activate the connection to the pseudorail more quickly than is possible through the passive circuit of FIG. 4.

Therefore, what is needed is a FET switch that isolates the primary FET bulk from ground (for undervoltage conditions) and that maintains the primary FET's gate potential at or about the potential of that transistor's bulk. What is also needed is such a FET switch that offers less resistance and capacitance than prior switches. Yet further, what is needed is a FET switch that may be selectably activated to isolate a node from overvoltage or undervoltage potential deviations that are relatively small.

SUMMARY OF THE INVENTION

It is an object of the present invention to provide a semiconductor circuit that acts as a switch for digital and analog operations. It is also an object of the present invention to provide a semiconductor switch that is a transfer gate or pass gate operable for a broad range of supply voltages, including supply voltages of less than five volts. It is a further object of the present invention to provide a transfer gate circuit that remains operable in the manner intended during undershoot conditions. Included as part of that object is the goal to provide a FET switch that isolates the primary FET bulk from ground when the switch is disabled in order to prevent a parasitic NPN bipolar transistor condition. A further goal is to keep the primary transistor's gate potential substantially the same as or lower than its bulk potential. It is an object to provide such an FET switch circuit with reduced resistance and capacitance characteristics and that optimizes the performance for the user. Finally, it is an object of the present invention to provide such a switch circuit having logic means to enable the user to actively harden the switch so as to isolate it from relatively small overvoltage or undervoltage variations.

These and other objectives are achieved in the present invention through the introduction of a logic sensor subcircuit coupleable to the bulk of the primary pass gate transistor previously described. The FET switch circuit of the present invention, including the sensor subcircuit, is coupled to the high- and low-potential power rails, and to the input and/or output nodes of circuitry to which it may be coupled. The sensor subcircuit and logic driver forming a part thereof, isolates the primary FET switch that is the input/output transfer device under all input/output voltage conditions. In summary, the single NMOS transistor of the prior art shown in FIG. 4 is used as the switch. Coupled to the gate of that single NMOS transistor is a control subcircuit. Coupled to the bulk of the single NMOS transistor is the sensor subcircuit. The sensor subcircuit, when activated, is designed to regulate the potential of the bulk of the primary switch transistor in relation to the potential at the first and second (either can be input or output) circuit node. The sensor subcircuit chooses which, if any, of the two circuit nodes is less than ground and ensures that the signal from that node is supplied as the bulk potential to the bulk of the primary switch transistor of the present invention. Thus, the bulk of the primary switch or transfer transistor of the present invention will always be at the lowest potential possible and therefore will not develop a parasitic conduction potential condition.

The sensor subcircuit may be developed in any of a number of known ways and is preferably a logic device. In particular, it has been determined that a differential circuit such as a differential comparator may be used to evaluate the potential difference between the low rail and each of the circuit nodes. The resultant output from the differential sensing circuit is a complementary pair of output signals that are introduced to one or more logic gates for outputting the appropriate signal to ensure that the less-than-ground potential associated with either of the circuit nodes is coupled to the pass gate transistor's bulk. It is to be noted that a differential sensing circuit is provided for each circuit node in which the circuit node and the ground power rail are the inputs to the circuit for comparison.

The logic gates used to couple the appropriate circuit node to the pass gate transistor's bulk may be any sort contemplated by those skilled in the art. Tailoring of the system so as to define the undershoot condition that causes a change in the coupling of the primary transistor's bulk to a circuit node may be accomplished through the selected sensitivity of the differential sensing circuitry. Of course, when the circuit nodes are not in an undershoot (or overshoot) condition, the bulk of the pass gate transistor is ordinarily tied to ground. Additional circuitry ensures that signal transfer is not inhibited under ordinary conditions.

The circuit of the present invention further includes a controller circuit designed to link the gate of the transfer transistor to the enable signal in a way that ensures complete operational capability of the bus switch under all conditions. In particular, the controller circuit preferably includes one or more inverter sets in a chain having its output coupled to the transfer transistor's gate. The output of the inverter is also preferably coupled to a bulk potential coupling circuit that ensures standard operation of the bus switch when enabled.

These and other advantages of the present invention will become apparent upon review of the following detailed description of the embodiments of the invention, the accompanying drawings, and the appended claims.

DETAILED DESCRIPTION OF THE PREFERRED EMBODIMENTS OF THE INVENTION

Figure 5:
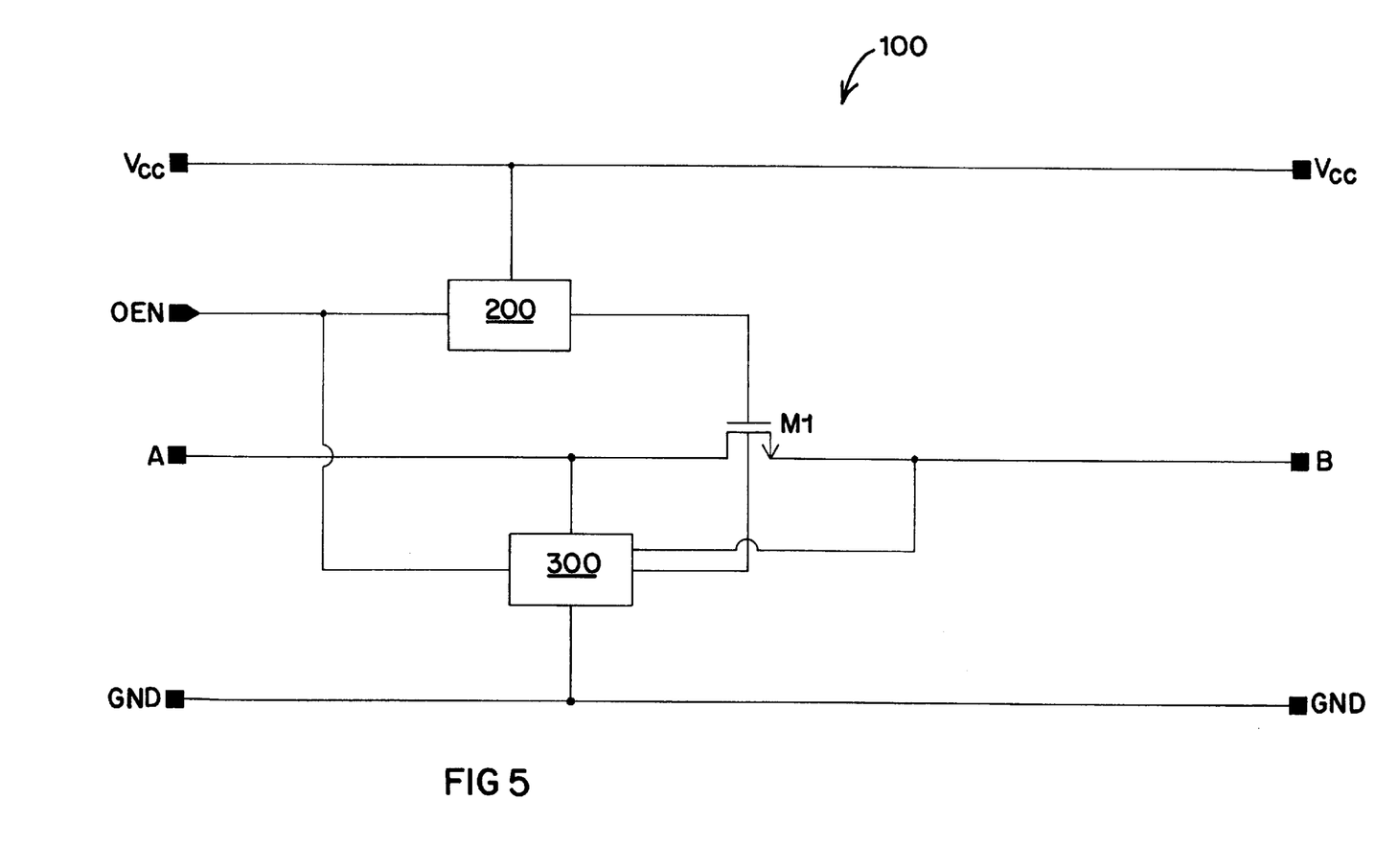
FIG. 5 is a schematic block diagram of the active undershoot tolerant FET switch circuit of the present invention, showing an NMOS transistor in combination with a logic sensor circuit and a controller as the primary transfer components of the bus switch that is couplable to an extended circuit.

An active undershoot-hardened bus switch 100 of the present invention is shown in FIG. 5. The switch 100 includes an enable controller circuit 200, supplied by a standard high-potential power rail Vcc, a primary transfer transistor M1, and a logic sensor circuit 300 coupled to a bulk of the transistor M1. Transistor M1 is the primary regulator of the transfer of a signal between nodes A and B. It is preferably an N-type MOS transistor formed with an isolated P-type well. Either of node A or node B may be an input node or an output node, dependent upon the direction of the signal passing between the external circuitry coupled to those two nodes. Enable controller circuit 200 is used to activate the transfer transistor M1 in a manner well known to those skilled in the art. Logic sensor circuit 300, when enabled, is used to link the bulk of transistor M1 to that power source having the most negative potential, whether it is the potential associated with node A, node B, or standard low-potential power rail GND. It is to be noted that circuit 200 and circuit 300 may be implemented in a variety of ways. The key is to permit the logic sensor circuit 300 to detect the potential variation that triggers linking of the M1 bulk to a particular one of the input/output nodes or GND.

Figure 6:
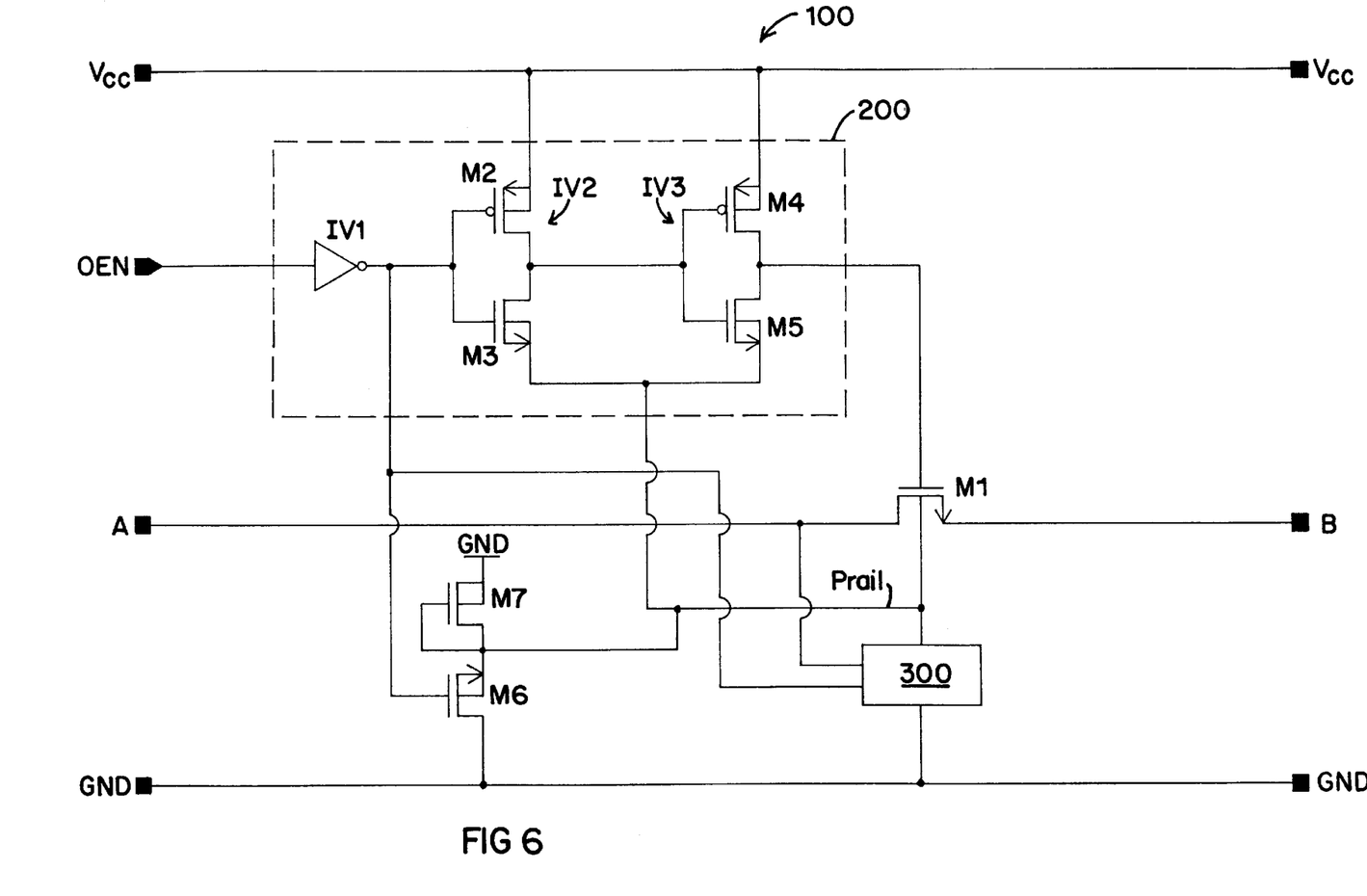
FIG. 6 is a simplified schematic diagram of the active undershoot tolerant FET switch of the present invention showing some detail of the enable circuit of the device.

One preferred example of the design of the switch 100 including details of a design of enable control circuit 200 in context is shown in FIG. 6. In order to take full advantage of the use of a single transfer transistor in the switch 100, the bulk of M1 is coupled to the pseudo-rail Prail. Logic sensor circuit 300 is coupled to both nodes A and B and to GND such that, when active, it in turn actively defines the potential of Prail as always being the lower of the potential at node A, node B, or GND. It is to be noted that the switch 100 is designed such that the bulk of M1 is "protected" regardless of whether undershoot occurs at node A or node B. Specifically, sensor circuit 300 is coupled to nodes A and B and GND with means to be described herein to select the lowest potential associated with those three references to transmit to Prail.

The circuit 100 shown in FIG. 6 blocks parasitic conduction caused by the bipolar effect of transistor M1 through the connection of the bulk of M1 to Prail and the configuration of circuit 300. Bipolar parasitic conduction would otherwise occur during undershoot events occurring at both node A and node B. However, since the bulk of M1, which is the equivalent of the base of the parasitic bipolar transistor, will be at the lowest potential of either node, and therefore lower than the potential at GND during the undershoot event, there is insufficient potential to cause a turning on of that device. It is to be noted that logic sensor circuit 300 is preferably activated through its coupling to enable node OEN such that when the transfer transistor M1 is to be activated, the sensor circuit 300 will also be activated. Of course, alternative means well known to those skilled in logic sensor design may be employed for alternative methods of activating circuit 300.

The circuit 100 of FIG. 6 is also designed to prevent the parasitic conduction that can otherwise occur when field effect potential is sufficient within M1 to cause a gate to bulk potential exceeding Vt. In particular, this is accomplished by referencing the enabling controller circuit 200 to Prail rather then to GND. Circuit 200 includes first inverter IV1 having an input coupled to circuit enable node OEN, and an output coupled to a second inverter IV2. Second inverter IV2 includes PMOS transistor M2 and NMOS transistor M3 coupled as shown. The output of second inverter IV2 is coupled to an input of third inverter IV3. Third inverter IV3 includes PMOS transistor M4 and NMOS transistor M5. The output of third inverter IV3 is coupled to the gate of transfer transistor M1 so as to control its operation. It is to be noted that the sources of inverter transistors M3 and M5 are coupled to Prail so as to prevent parasitic conduction as earlier stated.

With continuing reference to FIG. 6, NMOS transistor M6 having its gate coupled to the output of IV1, its drain coupled to GND, and its source coupled to Prail, provides a shunt to Prail when the circuit 100 is on. Transistor M7 essentially acts as a diode enabling current flow through the switch 100 when the sensor circuit 300 is inactive. The current flow in that instance is achieved through first inverter IV1, second inverter IV2, third inverter IV3, and then cycles through M7 as necessary.

Figure 7:
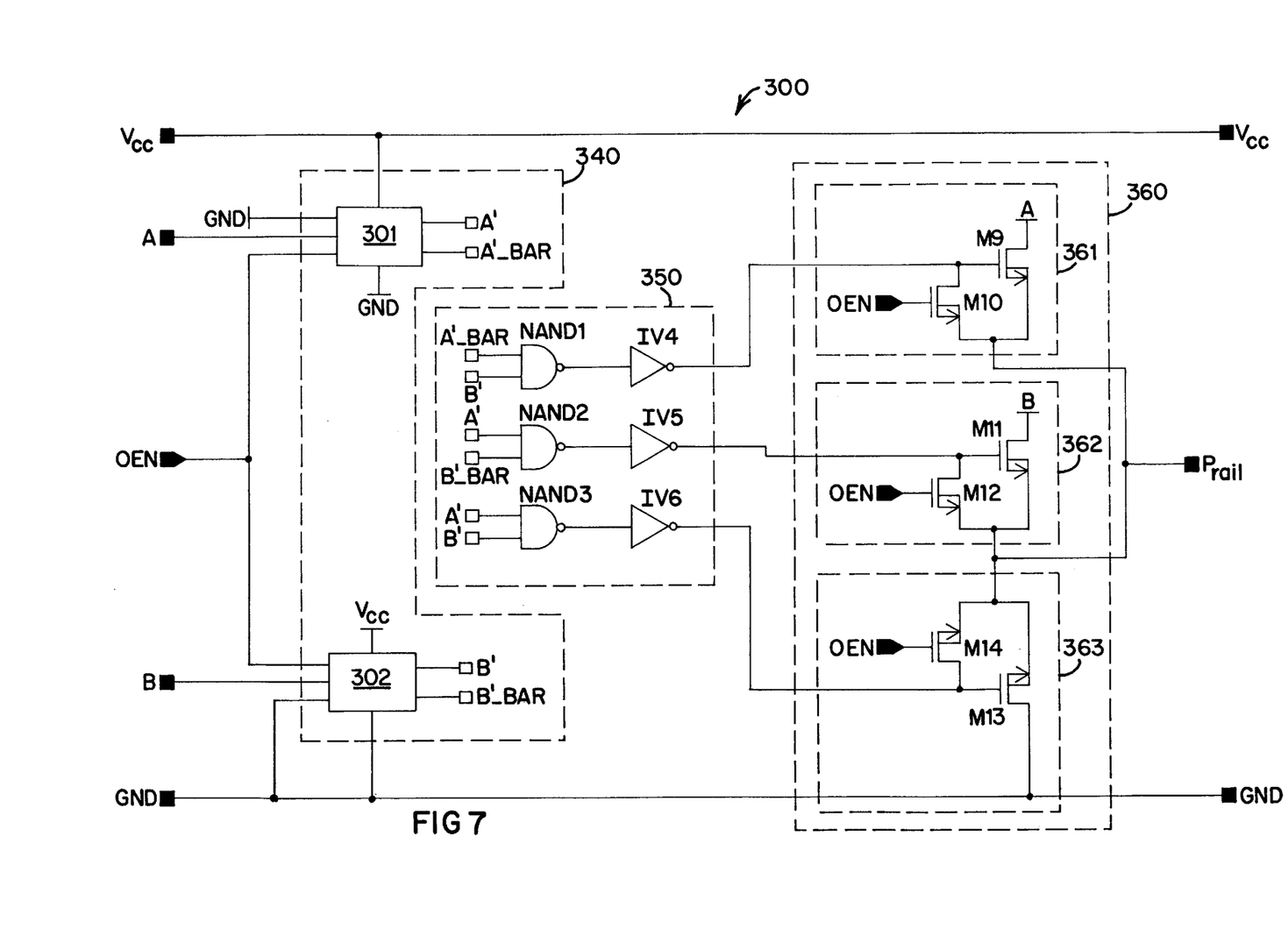
FIG. 7 is a simplified schematic diagram of a preferred arrangement of the active differential logic sensor circuit of the present invention, showing a pair of differential comparator subcircuits of the present invention.

As illustrated in FIG. 7, the logic sensor circuit 300 of the present invention is a differential logic device including a differential amplifier circuit 340. Circuit 340 includes a first differential comparator circuit 301 and a second differential comparator circuit 302. Circuit 301 is enabled by enable node OEN of switch 100, or some other form of enabling circuitry. It is designed to receive the signals from node A and GND for comparison and is preferably powered by power rails Vcc and GND. It provides a complementary output pair at true output node A'and its complement node A'_BAR. Similarly for second differential comparator circuit 302, enablement is preferably through enable node OEN of switch 100, or some other form of enabling circuitry. It is designed to receive signals from node B and GND and is preferably powered by power rails Vcc and GND. Circuit 302 provides a complementary output pair at true output node B' and its complement node B'_BAR.

Differential signals A', A'_BAR, B', and B'_BAR of circuit 340 provide the input signals to driver logic circuit 350 that is in turn used to regulate component drivers of driver circuit 360 used to output a potential signal to Prail. Those skilled in the art will readily recognize that any suitable configuration of logic devices may be employed to establish the output set associated with driver logic circuit 350. In general, however, the circuit 300 and its relevant sub-circuits are configured such that in operation, when node A is at a potential less than the potential of GND, node A is connected to Prail. When node B is at a potential less than the potential of GND, node B is connected to Prail. When nodes A and B are both at potentials higher than the potential of GND, Prail is connected to GND. Finally, when nodes A and B are both at potentials less than the potential of GND, Prail is connected to GND.

For purposes of illustration, the particular circuit 350 shown in FIG. 7 preferably includes first NAND gate NAND1 having A'_BAR and B' as its inputs, with an output coupled to fourth inverter IV4. Circuit 350 further includes second NAND gate NAND2 having A' and B'_BAR as its inputs, with an output coupled to fifth inverter IV5. Finally, circuit 350 includes third NAND gate NAND3 having A' and B' as its inputs, with an output coupled to sixth inverter IV6. This arrangement of circuit 350 ensures that logic comparisons are made of the signals associated with nodes A, B, and GND.

With continuing reference to FIG. 7, the outputs of inverters IV4–IV6 are separately coupled to driver circuit 360 as follows. First, the output of inverter IV4 is coupled to A-node connector 361 formed of NMOS transistor M9 and NMOS transistor M10. Transistor M9 has a drain coupled to A, a gate coupled to the output of IV4, and a source coupled to Prail. Transistor M10 has a gate coupled to OEN, a drain coupled to the output of inverter IV4, and a source coupled to Prail. Second, the output of inverter IV5 is coupled to B-node connector 362 formed of NMOS transistor M11 and NMOS transistor M12. Transistor M11 has a drain coupled to B, a gate coupled to the output of IV5, and a source coupled to Prail. Transistor M12 has a gate coupled to OEN, a drain coupled to the output of inverter IV5, and a source coupled to Prail. Finally, the output of inverter IV6 is coupled to GND-rail connector 363 formed of NMOS transistor M13 and NMOS transistor M14. Transistor M13 has a drain coupled to GND, a gate coupled to the output of IV6, and a source coupled to Prail. Transistor M14 has a gate coupled to OEN, a drain coupled to the output of inverter IV6, and a source coupled to Prail. It is important to note that inverters IV4–IV6 are preferably three-state inverters, each including a PMOS transistor coupled in series with Vcc such that when OEN is high, the PMOS transistor of the particular inverter is off, thereby preventing shorting conditions on transistors M10, M12, and M14 when OEN is high and the outputs of inverters IV4–IV6 are also high.

Figure 8:
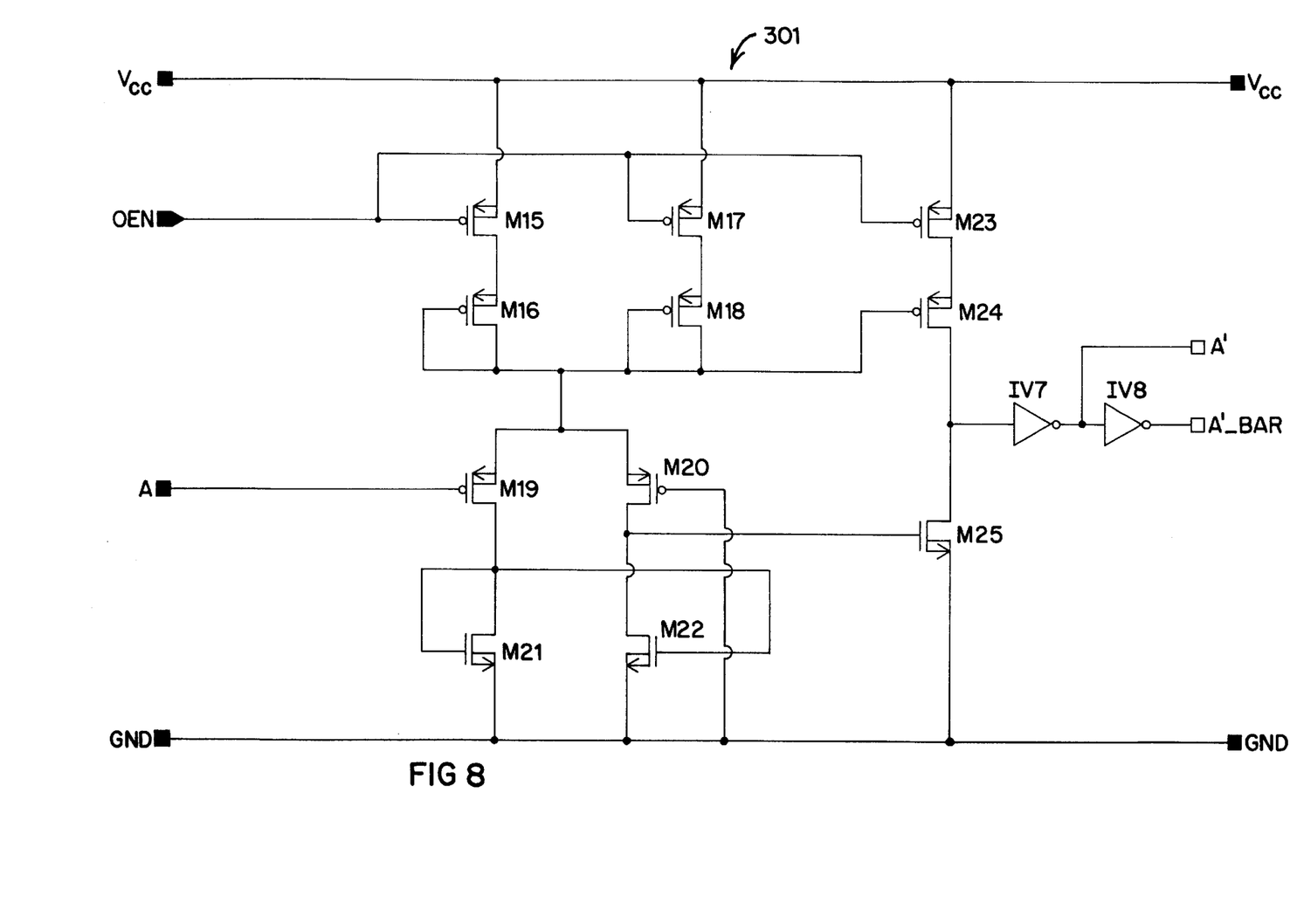
FIG. 8 is a schematic diagram of a preferred arrangement of one of the pair of differential comparator subcircuits of the present invention.

Details of the preferred design of circuit 301 are illustrated in FIG. 8. Although FIG. 8 illustrates and describes the comparator circuit associated with the signal at node A, it is to be understood that circuit 302 may be configured in the same way for creating a differential signal in relation to the signal at node B. For purposes of the exemplar design of circuit 301, it is noted that its operation is regulated by the signal applied at enable node OEN. Specifically, PMOS transistors M15, M17, and M23 have their control gates coupled to OEN such that a logic high at that node disables circuit 301. Diode-wired PMOS transistors M16, M18, and M24 enable coupling of the pull-up transistors to high-potential power rail Vcc when an enabling signal is applied. Differential PMOS transistor pair M19 and M20 provide the full-rail differential signal output of the circuit 301 as a function of the signals applied at A and GND, respectively. In that regard, the gate of M19 is coupled to A while the gate of M20 is coupled to GND. The drain of M19 is coupled to the drain of diode-wired NMOS transistor M21 and the drain of M20 is coupled to the drain of diode-wired NMOS transistor M22.

With continuing reference to FIG. 8, pull down NMOS transistor M25 effectively regulates the complementary output signal pair of circuit 301. Specifically, when the circuit 301 is enabled, the pull-up branch comprising transistors M23 and M24 are on. If M25 is off, the signal to inverter IV7 is substantially equivalent to a logic high corresponding to full-rail Vcc potential. If M25 is off, the signal to inverter IV7 is substantially equivalent to a logic low corresponding to full-rail GND potential. Therefore, when transistor M20 is on, it turns M25 on so as to deliver to IV7 a logic low signal. In order to turn differential transistor M20 on, it is necessary for the potential at GND to be less than the potential at node A, as is generally desired. However, when an undershoot condition occurs at node A, transistor M19 will turn on and transistor M20 will not. The difference between the potential at node A and the potential of GND that determines the signal applied to IV7 is selectable by the user as a function of the sensitivity of transistors M19 and M20. Whereas the circuit of FIG. 4 provided a voltage state to the bulk of transistor M1, the circuit of the present invention provides a logic state output that more certainly and more quickly couples that bulk to the lowest potential. For purposes of the present invention, it has been observed that an undershoot at node A or at node B of about 0.02V may be sufficient to trigger the coupling to Prail.

The difference between the present invention and the prior-art of FIG. 4 lies in the drive of the signal applied to the pseudorail Prail. Specifically, whereas the prior art required an undershoot condition on the order of a Vt differential, the use of the differential comparator ensures that relatively smaller differences will trigger full-rail logic signals ensuring that the Prail will be strongly coupled to the node or rail having the lowest potential. That opportunity is established initially through the differential transistor pair M19 and M20, the output of which is a full-rail signal at the output of inverter IV7 to node A' and its complementary output through inverter IV8 to node A'_BAR. Moreover, the increased sensitivity of circuit 100 results in less leakage through the device during undershoot events when compared to the leakage occurring during such events in the prior switch circuitry.

The active logic sensor circuit 300 shown in FIG. 7 including a pair of differential circuits of the type shown in FIG. 8, operates as follows. When the circuit 300 is enabled, the potential of the signal at A is compared by circuit 301 to the potential of GND. When A potential is less than GND potential, A' is a logic low and A'_BAR is a logic high. When A potential is equal to or greater than GND potential, A' is a logic high and A'_BAR is a logic low. At the same time, the potential of the signal at B is compared by circuit 302 to the potential of GND. When B potential is less than GND potential, B' is a logic low and B'_BAR is a logic high. When B potential is equal to or greater than GND potential, B' is a logic high and B'_BAR is a logic low. Taking the example where A' is a logic low and B' is a logic high, as is the case when there is an undershoot condition at A, logic driver circuit 350 acts as follows. First, NAND1 outputs a logic low, IV4 outputs a logic high, and the gate of transistor M9 is high such that circuit 361 is active so as to conduct to Prail and, therefore, the bulk of transfer transistor M1, the potential associated with node A. At the same time, the output of NAND2 is high, inverter IV5 output is low, and circuit 362 is inactive. Similarly, the output of NAND3 is high, inverter IV6 output is low, and circuit 363 is also inactive.

For the condition where there is an undershoot at B but not at A, A' is a logic high and B' is a logic low, and logic driver circuit 350 acts as follows. First, NAND1 outputs a logic high, IV4 outputs a logic low, and the gate of transistor M9 is low such that circuit 361 is inactive. At the same time, the output of NAND2 is low, inverter IV5 output is high, and circuit 362 is active so as to conduct to Prail and, therefore, the bulk of transfer transistor M1, the potential associated with node B. As in the first example, the output of NAND3 is high, inverter IV6 output is low, and circuit 363 is also inactive.

In the final example when there is no undershoot condition at either node A or node B, circuit 300 operates as follows. First, NAND1 outputs a logic high, IV4 outputs a logic low, and the gate of transistor M9 is low such that circuit 361 is inactive. At the same time, the output of NAND2 is also high, inverter IV5 output is low, and circuit 362 is inactive. Finally, the output of NAND3 is high, inverter IV6 output is low, and circuit 363 is activated such that the potential coupling of Prail is such that the potential applied to the bulk of transfer transistor M1 is that of GND.

While the present invention has been described with specific reference to particular embodiments, it is to be understood that all modifications, variants, and equivalents are deemed to be within the scope of the following appended claims.

What is claimed is:

1. An active undershoot-hardened bus switch for regulating the transfer of a logic signal between a first node and a second node, wherein the logic signal is transferred from the first node to the second or from the second node to the first, or a combination thereof, said bus switch comprising:

a. an enable signal node coupled to a circuit enable device and for receiving a bus switch activation signal;

b. a MOS transfer transistor having a gate coupled to said enable signal node, a source coupled to the first node, and a drain coupled to the second node;

c. a differential sense circuit having a first input coupled to the first node, a second input coupled to the second node, and third input coupled to a low-potential power rail, wherein said differential sense circuit is designed to compare the signals at said first input, said second input, and said third input and select the lowest one for transmission to a sense circuit output; and d. a pseudo low-potential power rail coupled between said sense circuit output and a bulk region of said transfer transistor.

2. The bus switch as claimed in claim 1 wherein said circuit enable device is coupled between said enable signal node and the gate of said transfer transistor.

3. The bus switch as claimed in claim 1 wherein said sense circuit includes a first differential comparator having a first input coupled to the first node and a second input could to the low-potential power rail, and a second differential comparator having a first input coupled to the second input node and a second input coupled to the low-potential power rail, wherein said first differential comparator provides a first logic signal output true to the signal associated with the first node, and a complement output that provides a complementary logic signal of said first logic signal, and wherein said second comparator provides a second logic signal output true to the signal associated with the second node, and a complement output that provides a complementary logic signal of said second logic signal.

4. The bus switch as claimed in claim 3 wherein said sense circuit further includes a logic driver circuit having input nodes coupled to said first logic signal output, said complement output of said first logic signal output, said second logic signal output, and said complement output of said second logic signal output, wherein said logic driver circuit provides a first logic driver output, a second logic driver output, and a third logic driver output.

5. The bus switch as claimed in claim 4 wherein said logic driver circuit includes:

a. a first logic device having inputs coupled to said first logic signal output and said second logic signal output and an output coupled to said first logic driver output;

b. a second logic device having inputs coupled to said first logic signal output and said complement signal of said second logic signal output and an output coupled to said second logic driver output; and c. a third logic device having inputs coupled to said second logic signal output and said complement signal of said first logic signal output and an output coupled to said third logic driver output.

6. The bus switch as claimed in claim 5 wherein each of said first logic device, said second logic device, and said third logic device includes a NAND gate having an output coupled to an input of an inverter, wherein an output of said inverter is said output of said logic devices.

7. The bus switch as claimed in claim 6 wherein said sense circuit further includes a connector circuit having as inputs said output of said first logic device, said output of said second logic device, and said output of said third logic device, and wherein an output of said connector circuit is coupled to said pseudo low-potential power rail.

8. The bus switch as claimed in claim 7 wherein said connector circuit includes:

a. a first connector having an input control node coupled to said output of said first logic device, an output coupled to said pseudo low-potential power rail, and a supply node coupled to the first node;

b. a second connector having an input control node coupled to said output of said second logic device, an output coupled to said pseudo low-potential power rail, and a supply node coupled to the second node; and c. a third connector having an input control node coupled to said output of said third logic device, an output coupled to said pseudo low-potential power rail, and a supply node coupled to the low-potential power rail.

9. The bus switch as claimed in claim 1 wherein said MOS transfer transistor is an NMOS transistor.

* * * * *